(12) United States Patent
Li et al.

(10) Patent No.: US 6,392,853 B1
(45) Date of Patent: May 21, 2002

(54) SPIN VALVE STRUCTURE DESIGN WITH LAMINATED FREE LAYER

(75) Inventors: Min Li; Simon H. Liao, both of Fremont; Cheng T. Horng, San Jose; Youfeng Zheng, Sunnyvale; Ru-Ying Tong, San Jose; Kochan Ju, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/489,973

(22) Filed: Jan. 24, 2000

(51) Int. Cl.$^7$ ............................ G11B 5/39; G11B 5/127; B32B 15/01; B32B 15/18
(52) U.S. Cl. .................. 360/324.12; 360/314; 428/692; 428/332; 428/611
(58) Field of Search ................................ 428/611, 678, 428/679, 680, 681, 682, 692, 693, 332, 333; 360/328, 126, 113, 313, 314, 315, 324, 324.1, 324.11, 324.12, 325, 327, 327.2, 327.21, 327.3, 327.33, 327.24; 324/252, 207.21

(56) References Cited

U.S. PATENT DOCUMENTS

| | | | | |
|---|---|---|---|---|
| 5,408,377 A | * | 4/1995 | Gurney et al. | 360/113 |
| 5,751,521 A | * | 5/1998 | Gill | 360/113 |
| 5,764,056 A | | 6/1998 | Mao et al. | 324/252 |
| 5,898,549 A | | 4/1999 | Gill | 360/113 |
| 5,920,446 A | * | 7/1999 | Gill | 360/113 |
| 6,133,732 A | * | 10/2000 | Hayashi | 324/252 |
| 6,175,476 B1 | * | 1/2001 | Huai et al. | 360/324.11 |
| 6,201,673 B1 | * | 3/2001 | Rottmayer et al. | 360/324.12 |
| 6,259,586 B1 | * | 7/2001 | Gill | 360/324.2 |

* cited by examiner

*Primary Examiner*—Deborah Jones
*Assistant Examiner*—Michael LaVilla
(74) *Attorney, Agent, or Firm*—George O. Saile; Stephen B. Ackerman

(57) ABSTRACT

The giant magnetoresistance (GMR) effect includes a contribution that is due to anisotropic magnetoresistance (AMR). Unfortunately the AMR effect tends to degrade the peak-to-peak signal asymmetry. Additionally, a high AMR/GMR ratio causes a larger signal asymmetry variation. It is therefor desirable to reduce both the AMR contribution as well as the AMR/GMR ratio. This has been achieved by modifying the free layer through the insertion of an extra layer of a highly resistive or insulating material at approximately mid thickness level. This layer is from 3 to 15 Angstroms thick and serves to reduce the Anisotropic Magneto-resistance contribution to the total magnetoresistance of the device. This reduces the GMR contribution only slightly but cuts the AMR/GMR ratio in half, thereby improving cross-track asymmetry and signal linearity.

22 Claims, 2 Drawing Sheets

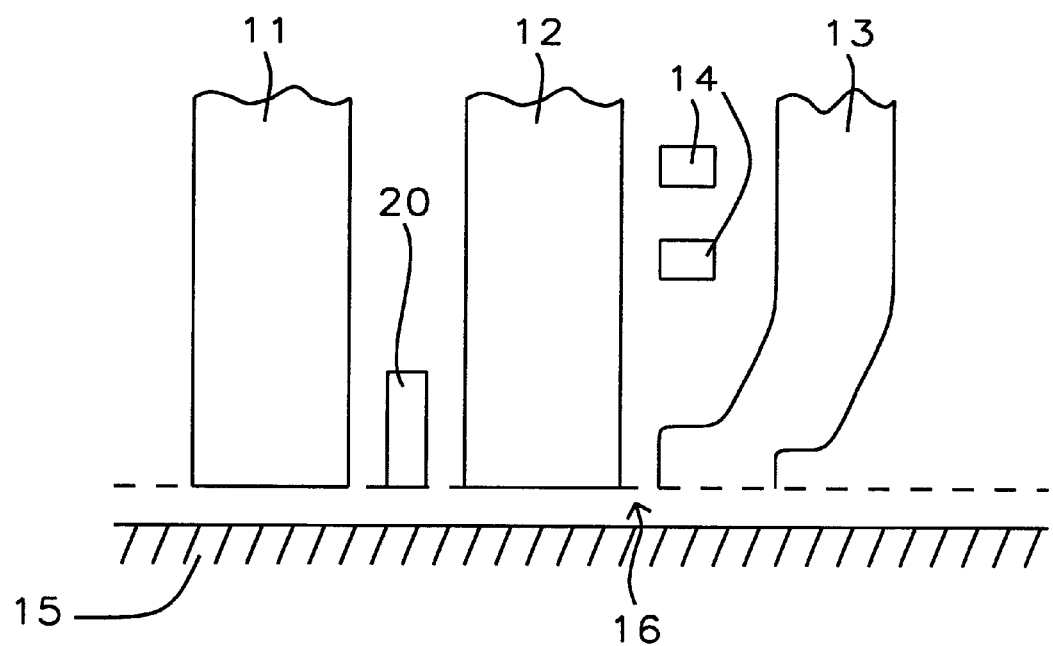
FIG. 1 – Prior Art
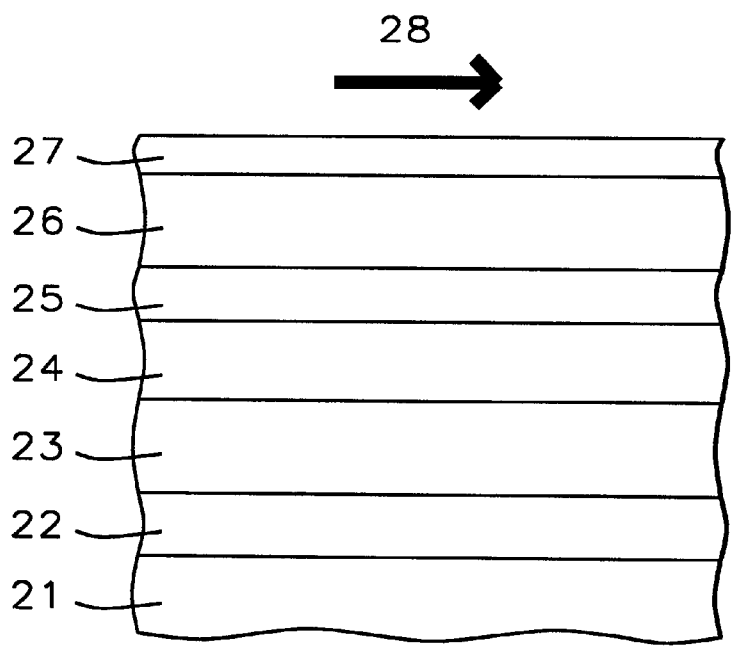
FIG. 2 – Prior Art

SPIN VALVE STRUCTURE DESIGN WITH LAMINATED FREE LAYER

FIELD OF THE INVENTION

The invention relates to the general field of giant magnetoresistive read heads for disk systems with particular reference to improving the AMR/GMR ratio.

BACKGROUND OF THE INVENTION

Read-write heads for magnetic disk systems have undergone substantial development during the last few years. In particular, older systems in which a single device was used for both reading and writing, have given way to configurations in which the two functions are performed by different structures. An example of such a read-write head is schematically illustrated in FIG. 1. The magnetic field that 'writes' a bit at the surface of recording medium 15 is generated by a flat coil, two of whose windings 14 can be seen in the figure. The magnetic flux generated by the flat coil is concentrated within pole pieces 12 and 13 which, while being connected at a point beyond the top edge of the figure, are separated by small gap 16. Thus, most of the magnetic flux generated by the flat coil passes across this gap with fringing fields extending out for a short distance where the field is still powerful enough to magnetize a small portion of recoding medium 15.

The present invention is directed towards the design of read element 20 which can be seen to be a thin slice of material located between magnetic shields 11 and 12 (12 doing double duty as a pole piece, as just discussed). The principle governing the operation of read sensor 20 is the change of resistivity of certain materials in the presence of a magnetic field (magneto-resistance). In particular, most magnetic materials exhibit anisotropic behavior in that they have a preferred direction along which they are most easily magnetized (known as the easy axis). The magneto-resistance effect manifests itself as an increase in resistivity when the material is magnetized in a direction perpendicular to the easy axis, said increase being reduced to zero when magnetization is along the easy axis. Thus, any magnetic field that changes the direction of magnetization in a magneto-resistive material can be detected as a change in resistance. We refer to the maximum increase in resistivity due to this anisotropy as AMR (anisotropic magneto-resistance).

It is now known that the magneto-resistance effect can be significantly increased by means of a structure known as a spin valve. The resulting increase (known as Giant magneto-resistance or GMR) derives from the fact that electrons in a magnetized solid are subject to significantly less scattering by the lattice when their own magnetization vectors (due to spin) are parallel (as opposed to anti-parallel) to the direction of magnetization of the solid as a whole.

The key elements of a spin valve structure are shown in FIG. 2. In addition to a seed layer 22 on a substrate 21 and a topmost cap layer 27, these key elements are two magnetic layers 23 and 25, separated by a non-magnetic layer 24. The thickness of layer 24 is chosen so that layers 23 and 25 are sufficiently far apart for exchange effects to be negligible (the layers do not influence each other's magnetic behavior at the atomic level) but are close enough to be within the mean free path of conduction electrons in the material. If, now, layers 23 and 25 are magnetized in opposite directions and a current is passed though them along the direction of magnetization (such as direction 28 in the figure), half the electrons in each layer will be subject to increased scattering while half will be unaffected (to a first approximation). Furthermore, only the unaffected electrons will have mean free paths long enough for them to have a high probability of crossing over from 23 to 25 (or vice versa). However, once these electron 'switch sides', they are immediately subject to increased scattering, thereby becoming unlikely to return to their original side, the overall result being a significant increase in the resistance of the entire structure.

In order to make use of the GMR effect, the direction of magnetization of one of the layers 23 and 25 is permanently fixed, or pinned. In FIG. 2 it is layer 25 that is pinned. Pinning is achieved by first magnetizing the layer (most often by depositing it in the presence of a magnetic field) and then permanently maintaining the magnetization by overcoating with a layer of antiferromagnetic material, or AFM, (layer 26 in the figure). Layer 23, by contrast, is a "free layer" whose direction of magnetization can be readily changed by an external field (such as that associated with a bit at the surface 15 of a magnetic disk).

The structure shown in FIG. 2 is referred to as a top spin valve because the pinned layer is at the top. It is also possible to form a 'bottom spin valve' structure where the pinned layer is deposited first (immediately after the seed and pinning layers). In that case the cap layer would, of course, be over the free layer.

Ideally, while the device is being operated, free layer 23 would be given a bias whereby its direction of magnetization was mid-way between that of the pinned layer and a direction orthogonal to that. Thus, the GMR effect would be present, but not to its full extent. Then when the magnetization direction of layer 23 was changed by the field associated with a bit on the surface of 15, the resistance of the device would either increase or decrease depending on the direction of the field coming from surface 15. In practice other requirements (such as good signal linearity and good cross-track asymmetry) make it necessary for the bias to be close to zero. Under these conditions, the AMR effect from the free layer degrades the peak-to-peak signal asymmetry. Additionally, a high AMR/GMR ratio causes a larger signal asymmetry variation.

The relationship between the resistance R of a spin valve structure and the angle between the magnetization directions θf and θp of the free and pinned layers, respectively is given by:

$$R = R_s[1 + 0.5 \times GMR \times \{1 - \cos(\theta f - \theta p)\} + AMR \times \{\cos \theta f\}^2] \quad (1)$$

where $R_s$ is the saturation (minimum achievable) resistance.

Equation (1) confirms that the signal contribution from AMR strongly depends on the AMR/GMR ratio. Reducing this ratio is not, in general, a straightforward thing to do since most steps that can be taken to reduce the AMR (such as choice of seed layer or a thinner free layer) also result in a reduction of the GMR. The present invention describes a spin valve structure in which both the AMR and the AMR/GMR ratio have been reduced.

A routine search for prior art was performed. While no references to the exact structure taught by the present invention were found, several references of interest were encountered. For example, Gill (U.S. Pat. No. 5,898,549) forms a pinned layer from three separate pinned layers. The first of these is formed on the pinning layer and, together with the second pinned layer is formed of a high resistivity material such as NiFeCr. They are separated by an anti-parallel coupling layer. The third pinned layer is of low resistivity material such as cobalt.

In U.S. Pat. No. 5,920,446, Gill describes a laminated free layer formed from two ferromagnetic layers separated by a non-magnetic, conducting spacer layer. A key feature is that the two outer layers of the laminate are coupled in an anti-parallel configuration. This arrangement allows the device to operate without a pinned (or pinning) layer.

Mao et al. (U.S. Pat. No. 5,764,056) teaches use of Nickel-Manganese as a pinning layer for, a pinned layer that is a laminate of two ferromagnetic materials separated by a non-magnetic conducting layer.

SUMMARY OF THE INVENTION

It has been an object of the present invention to provide a spin valve structure having both a low AMR as well as a low AMR/GMR ratio.

Another object of the invention has been that said spin valve structure be compatible with existing techniques for manufacturing spin valves.

A further object of the invention has been to improve cross-track asymmetry and signal linearity in magnetic read heads.

These objects have been achieved by modifying the free layer whereby an extra layer of a highly resistive or insulating material is inserted through the middle of the free layer. This layer is from 3 to 15 angstroms thick and serves to reduce the Anisotropic Magneto-resistance contribution to the total magneto-resistance of the device. This reduces the GMR contribution only slightly but cuts the AMR/GMR ratio in half, thereby improving cross-track asymmetry and signal linearity.

BRIEF DESCRIPTION OF THE DRAWINGS

FIG. 1 is a schematic illustration of a read-write head for a magnetic disk.

FIG. 2 is a cross-section of a spin valve structure of the prior art.

DESCRIPTION OF THE PREFERRED EMBODIMENTS

Figure 3:
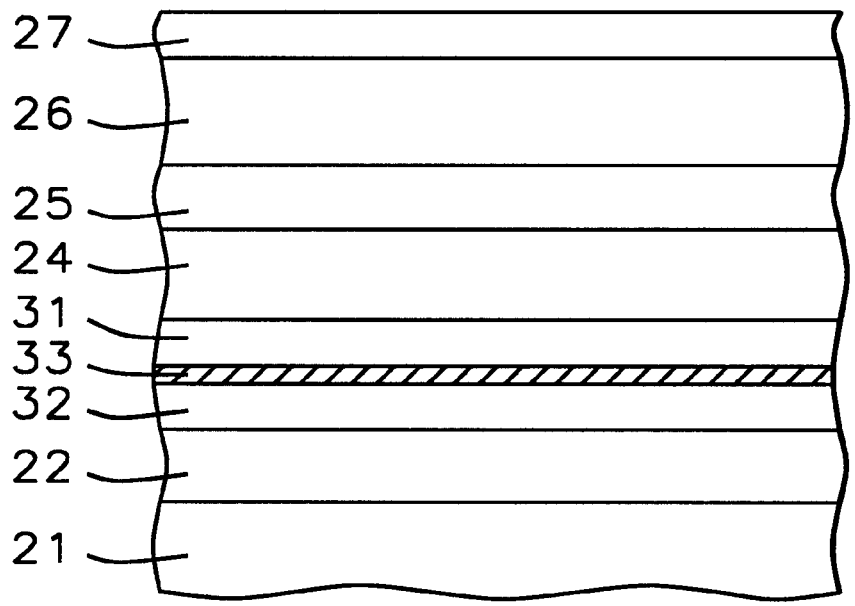
FIG. 3 is a cross-section of a spin valve structure built according to the teachings of the present invention.

Referring now to FIG. 3, we show there a schematic cross-section of a top spin valve structure that embodies the present invention. A comparison with FIG. 2 of the prior art will show that the key novel feature of the invention is the insertion of an additional layer at approximately the mid thickness level of the free layer. In the figure this is marked as layer 33 which separates former layer 23 (of the prior art) into two free sub-layers 31 and 32.

We refer to the inserted layer 33 as an AMR reduction layer because the AMR of the composite structure, layers 31, 32, and 33 is significantly less than that of layers 31 and 33, acting as a single layer. The AMR reduction layer needs to be an insulating or high resistivity material and its thickness should be between about 3 and 20 Angstroms. The insertion of layer 33 reduces the AMR because the AMR is lower for a thinner magnetoresistive layer.

Confirmation that an AMR reduction layer does in fact reduce the AMR was obtained through experiment, the results being summarized in TABLE I below:

TABLE I

Comparison of AMR with and without inserted AMR reducing layer

| LAYER STRUCTURE & thicknesses | $R_s$ | AMR |
|---|---|---|
| CZB55/NiFe60/CoFe3/Cu19/CZB50 | 23.02 | 1.21 |
| CZB45/NiFe30/CZB5/NiFe30/CoFe3/Cu21/CZB50 | 29.75 | 0.66 |

In the example shown in TABLE I, the AMR reduction layer was 5 Angstroms of CZB ($Ni_{60}Cr_{40}$). As can be seen, the AMR has been reduced by a factor of two.

We now present five embodiments of the present invention in which full spin valve structures that include AMR reduction layers are disclosed. Although the thicknesses quoted for the various layers are critical for the efficient operation of these embodiments, it is to be understood that small departures from these thicknesses could be introduced without departing from the basic spirit and novelty of the present invention.

Common to all five embodiments are a substrate, a seed layer, and a cap layer. Suitable materials for substrates include aluminum oxide. Embodiments 1, 2, and 3 are top spin valve structures while embodiments 4 and 5 are bottom spin valve structures. Materials for the seed layer include tantalum, nickel-iron-chromium, and nickel-chromium for embodiments 1, 2, and 3, and nickel-iron-chromium or nickel-chromium for embodiments 4 and 5. Suitable materials for the cap layer include tantalum, nickel-iron-chromium, and nickel-chromium for all embodiments.

The material used for the AMR reduction layer should be high resistivity or insulating. Examples include nickel-iron-chromium and nickel-chromium as well as all insulating materials that have specular reflection of electrons at their interfaces with both the underlying and overlying free sublayers. The thickness of the AMR reducing layer should be between about 3 and 15 Angstroms. Any AMR reducing layer that meets these conditions may be used in any of the embodiments described in TABLE II below.

TABLE II layer structures for five embodiments of the invention

| DESCRIPTION | 1st embod. | 2nd embod. | 3rd embod. | 4th embod. | 5th embod. |
|---|---|---|---|---|---|
| first free sub-layer | NiFe | NiFe | HCL/NiFe | CoFe/NiFe | CoFe/NiFe |
| AMR reducing layer | high resistivity, as detailed above, for any embodiment | | | | |
| second free sub-layer | NiFe/CoFe | NiFe/CoFe | NiFe/CoFe | NiFe | NiFe |
| spacer layer | Cu | Cu | Cu | Cu | Cu |
| magnetically pinned layer | CoFe | CoFe/Ru/CoFe | CoFe/Ru/CoFe | CoFe | CoFe/Ru/CoFe |
| magnetic pinning layer | an AFM such as MnPt, MnPtPd, MnNi, IrMn, etc. | | | | |

Note that HCL (=high conductivity layer such as Cu or CuNi, for example)

The thicknesses, in Angstroms, of the various layers used in the five embodiments are summarized in TABLE III.

TABLE III layer thicknesses, in Angstroms, for the five embodiments

| DES-CRIPTION | 1st embod. | 2nd embod. | 3rd embod. | 4th embod. | 5th embod. |
|---|---|---|---|---|---|
| first free sub-layer | 20–50 | | 5–30/ 20–50 | | 0–10/30–50 |
| AMR reducing layer | | | 3–15 | | |
| second free sub-layer | | 20–50/0–10 | | | 30–50 |
| spacer layer | | 18–20 | | | 18–30 |
| magnetically pinned layer | 15–20 | 15–25/3–9/15–25 | | 15–20 | 15–25/3–9/15–25 |
| magnetic pinning layer | | | 100–200 | | |

In order to verify that the structures described above have both lower AMR and lower AMR/GMR ratios, relative to the prior art, four different spin valve structures were formed, according to the teachings of the present invention, and compared with structures of the prior art. The experimental structures are summarized in TABLE IV below.

TABLE IV four spin valve structures based on the present invention

| DES-CRIPTION | MAT-ERIAL | 1st expt. | 2nd expt. | 3rd expt. | 4th expt. |
|---|---|---|---|---|---|
| | | THICKNESSES (Å) | | | |
| seed layer | CZB | 45 | 45 | 45 | 45 |
| first free sub-layer | NiFe | 55 | 55 | 30 | 15/30 |
| AMR reducing layer | CZB | 5 | 10 | 5 | 5 |
| second free sub-layer | NiFe | 30 | 30 | 30/3 | 30/3 |
| spacer layer | Cu | 21 | 21 | 21 | 21 |
| magnetically pinned layer | CoFe/Ru/CoFe | 18/7.5/23 | 18/7.5/23 | 18/7.5/23 | 19/7.5/21 |
| magnetic pinning layer | MnPt | 150 | 150 | 150 | 150 |
| cap layer | CZB | 50 | 50 | 50 | 50 |

These structures were then compared with three spin valve structures of the prior art that were essentially the same except for the absence of an AMR reducing layer. In this regard, prior art #1 is similar to the $1^{st}$ and $2^{nd}$ experiments, prior art #2 to the $3^{rd}$ experiment, and prior art #3 to the $4^{th}$ experiment. The results are summarized in TABLE V below.

TABLE V comparison of prior art spin valves with those formed according to the teachings of the present invention

| type | Rs | GMR | AMR | AMR/GMR |
|---|---|---|---|---|
| Prior art #1 | 11.3 | 6.2 | 1.64 | 0.26 |
| 1st expt. | 13.7 | 5.32 | 0.74 | 0.14 |
| 2nd expt. | 13.86 | 5.24 | 0.73 | 0.14 |
| prior art #2 | 14.56 | 9 | 1.2 | 0.13 |
| 3rd expt. | 15.49 | 9.15 | 0.66 | 0.07 |

TABLE V-continued comparison of prior art spin valves with those formed according to the teachings of the present invention

| type | Rs | GMR | AMR | AMR/GMR |
|---|---|---|---|---|
| prior art #3 | 12.23 | 8.54 | 1.2 | 0.14 |
| 4th expt. | 13.8 | 7.77 | 0.66 | 0.08 |

It is apparent from the date presented in TABLE V that spin valves that include the AMR reducing layer have GMR values comparable to those found in the prior art but noticeably lower AMRs that are about half as large as those found in prior art structures.

While the invention has been particularly shown and described with reference to the preferred embodiments thereof, it will be understood by those skilled in the art that various changes in form and details may be made without departing from the spirit and scope of the invention.

What is claimed is:

1. A spin valve structure, comprising:

a first free sub-layer;

an AMR reducing layer on the first free sub-layer;

a second free sub-layer on the AMR reducing layer;

a spacer layer on the second free sub-layer; and a magnetically pinned layer on the spacer layer.

2. The spin valve described in claim 1 wherein said AMR reducing layer is selected from the group consisting of nickel-iron-chromium, nickel-chromium, and all insulating materials that have specular reflection of electrons at their interfaces with said first and second free sub-layers.

3. The spin valve described in claim 1 wherein said AMR reducing layer has a thickness between 3 and 15 Angstroms.

4. A spin valve structure, comprising:

a substrate;

a seed layer on said substrate;

a first free sub-layer of nickel-iron, between about 20 and 50 Angstroms thick, on the seed layer;

an AMR reducing layer, between 3 and 15 Angstroms thick, on the first free sub-layer;

a second free sub-layer of nickel-iron that is coated with less than 10 Angstroms of cobalt-iron, for a total thickness between about 20 and 50 Angstroms, on the AMR reducing layer;

a spacer layer on the second free sub-layer;

a magnetically pinned layer of cobalt-iron on the spacer layer;

a magnetic pinning layer of antiferromagnetic material on the magnetically pinned layer; and a cap layer on the pinning layer.

5. The spin valve described in claim 4 wherein the AMR reducing layer is selected from the group consisting of nickel-iron-chromium, nickel-chromium, and all insulating materials that have specular reflection of electrons at their interfaces with said first and second Free sub-layers.

6. The spin valve described in claim 4 wherein the spacer layer further comprises a layer of copper, between about 18 and 30 Angstroms thick.

7. A spin valve structure, comprising:

a substrate;

a seed layer on said substrate;

a first free sub-layer of nickel-iron, between about 20 and 50 Angstroms thick, on the seed layer;

an AMR reducing layer, between 3 and 15 Angstroms thick, on the first free sub-layer;

a second free sub-layer of nickel-iron and cobalt-iron, between about 20 and 50 Angstroms thick, on the AMR reducing layer;

a spacer layer on the second free sub-layer;

a magnetically pinned layer on the spacer layer;

a magnetic pinning layer of antiferromagnetic material on the magnetically pinned layer; and a cap layer on the pinning layer.

8. The spin valve described in claim 7 wherein the AMR reducing layer is selected from the group consisting of nickel-iron-chromium, nickel-chromium, and all insulating materials that have specular reflection of electrons at their interfaces with said first and second Free sub-layers.

9. The spin valve described in claim 7 wherein the spacer layer further comprises a layer of copper, between about 18 and 30 Angstroms thick.

10. The spin valve described in claim 7 wherein the magnetically pinned layer further comprises a layer of cobalt-iron, about 23 Angstroms thick, on a layer of ruthenium about 7.5 Angstroms thick, on a layer of cobalt-iron about 18 Angstroms thick.

11. A spin valve structure, comprising:

a substrate;

a seed layer on said substrate;

a first free sub-layer on the seed layer;

an AMR reducing layer, between 3 and 15 Angstroms thick, on the first free sub-layer;

a second free sub-layer of nickel-iron and cobalt-iron, between about 20 and 50 Angstroms thick, on the AMR reducing layer;

a spacer layer on the second free sub-layer;

a magnetically pinned layer on the spacer layer;

a magnetic pinning layer of antiferromagnetic material on the magnetically pinned layer; and a cap layer on the pinning layer.

12. The spin valve described in claim 11 wherein the AMR reducing layer is selected from the group consisting of nickel-iron-chromium, nickel-chromium, and all insulating materials that have specular reflection of electrons at their interfaces with said first and second Free sub-layers.

13. The spin valve described in claim 11 wherein the spacer layer further comprises a layer of copper, between about 18 and 30 Angstroms thick.

14. The spin valve described in claim 11 wherein the magnetically pinned layer further comprises a layer of cobalt-iron, about 23 Angstroms thick, on a layer of ruthenium about 7.5 Angstroms thick, on a layer of cobalt-iron about 18 Angstroms thick.

15. The spin valve described in claim 11 wherein the first free sub-layer further comprises a layer of nickel-iron, between about 20 and 50 Angstroms thick, on a high conductivity layer between about 5 and 30 Angstroms thick, said high conductivity layer being selected from the group consisting of copper and copper-nickel.

16. A spin valve structure, comprising:

a substrate;

a seed layer on said substrate;

a magnetic pinning layer of antiferromagnetic material on the substrate;

a magnetically pinned layer of cobalt-iron, about 20 Angstroms thick, on the pinning layer;

a spacer layer on the magnetically pinned layer;

a first free sub-layer of cobalt iron and nickel-iron, between about 20 and 50 Angstroms thick, on the spacer layer;

an AMR reducing layer, between about 3 and 15 Angstroms thick, on the first free sub-layer;

a second free sub-layer of nickel-iron, between about 20 and 50 Angstroms thick, on the AMR reducing layer; and a cap layer on the second free sub-layer.

17. The spin valve described in claim 16 wherein the AMR reducing layer is selected from the group consisting of nickel-iron-chromium, nickel-chromium, and all insulating materials that have specular reflection of electrons at their interfaces with said first and second free sub-layers.

18. The spin valve described in claim 16 wherein the spacer layer is a layer of copper, between about 18 and 30 Angstroms thick.

19. A spin valve structure, comprising:

a substrate;

a seed layer on said substrate;

a magnetic pinning layer of antiferromagnetic material on the substrate;

a magnetically pinned layer on the pinning layer;

a spacer layer on the magnetically pinned layer;

a first free sub-layer of cobalt iron and nickel-iron, between about 20 and 50 Angstroms thick, on the spacer layer;

an AMR reducing layer, between about 3 and 15 Angstroms thick, on the first free sub-layer;

a second free sub-layer of nickel-iron, between about 20 and 50 Angstroms thick, on the AMR reducing layer; and a cap layer on the second free sub-layer.

20. The spin value described in claim 19 wherein the AMR reducing layer is selected from the group consisting of nickel-iron chromium, nickel-chromium, and all insulating materials that have specular reflection of electrons at their interfaces with said first and second free sub-layers.

21. The spin described in claim 19 wherein the spacer layer is copper between about 18 and 30 Angstroms thick.

22. The spin valve described in claim 19 wherein the magnetically pinned layer further comprises a layer of cobalt-iron, about 18 Angstroms thick, on a layer of ruthenium about 7.5 Angstroms thick, on a layer of cobalt-iron about 23 Angstroms thick.

* * * * *